(12) United States Patent
Asami

(10) Patent No.: US 8,872,251 B2
(45) Date of Patent: Oct. 28, 2014

(54) NONVOLATILE SEMICONDUCTOR MEMORY DEVICE AND MANUFACTURING METHOD THEREOF

(75) Inventor: Yoshinobu Asami, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 58 days.

(21) Appl. No.: 13/468,412

(22) Filed: May 10, 2012

(65) Prior Publication Data

US 2012/0217566 A1 Aug. 30, 2012

Related U.S. Application Data

(63) Continuation of application No. 12/436,580, filed on May 6, 2009, now Pat. No. 8,188,535.

(30) Foreign Application Priority Data

May 16, 2008 (JP) .................................. 2008-129961

(51) Int. Cl.
H01L 29/788 (2006.01)

(52) U.S. Cl.
USPC .... 257/319; 257/320; 257/321; 257/E29.129; 257/E29.3

(58) Field of Classification Search
USPC ........................ 257/319–321, E29.129, E29.3
See application file for complete search history.

(56) References Cited

U.S. PATENT DOCUMENTS

| | | | |
|---|---|---|---|
| 4,453,234 A * | 6/1984 | Uchida | 365/185.14 |
| 5,457,335 A | 10/1995 | Kuroda et al. | |
| 5,541,442 A * | 7/1996 | Keil et al. | 257/533 |
| 5,627,392 A | 5/1997 | Diorio et al. | |
| 5,767,544 A | 6/1998 | Kuroda et al. | |
| 5,825,063 A | 10/1998 | Diorio et al. | |
| 5,875,126 A | 2/1999 | Minch et al. | |
| 5,886,376 A | 3/1999 | Acovic et al. | |
| 5,888,868 A | 3/1999 | Yamazaki et al. | |
| 5,892,258 A | 4/1999 | Kobatake | |
| 5,898,613 A | 4/1999 | Diorio et al. | |

(Continued)

FOREIGN PATENT DOCUMENTS

| | | |
|---|---|---|
| CN | 101150147 | 3/2008 |
| EP | 0820102 A | 1/1998 |

(Continued)

OTHER PUBLICATIONS

International Search Report (Application No. PCT/JP2009/058954; PCT11510) Dated Aug. 18, 2009.

(Continued)

*Primary Examiner* — Michael Shingleton
(74) *Attorney, Agent, or Firm* — Nixon Peabody LLP; Jeffrey L. Costellia

(57) ABSTRACT

An object is to suppress reading error even in the case where writing and erasing are repeatedly performed. Further, another object is to reduce writing voltage and erasing voltage while increase in the area of a memory transistor is suppressed. A floating gate and a control gate are provided with an insulating film interposed therebetween over a first semiconductor layer for writing operation and erasing operation and a second semiconductor layer for reading operation which are provided over a substrate; injection and release of electrons to and from the floating gate are performed using the first semiconductor layer; and reading is performed using the second semiconductor layer.

10 Claims, 11 Drawing Sheets

(56) References Cited

U.S. PATENT DOCUMENTS

| | | |
|---|---|---|
| 5,914,894 A | 6/1999 | Diorio et al. |
| 5,960,265 A | 9/1999 | Acovic et al. |
| 5,986,927 A | 11/1999 | Minch et al. |
| 5,990,512 A | 11/1999 | Diorio et al. |
| 6,005,270 A | 12/1999 | Noguchi |
| 6,064,606 A | 5/2000 | Kuroda et al. |
| 6,125,053 A | 9/2000 | Diorio et al. |
| 6,144,581 A | 11/2000 | Diorio et al. |
| 6,452,835 B1 | 9/2002 | Diorio et al. |
| 6,498,369 B1 | 12/2002 | Yamazaki et al. |
| 6,501,689 B2 | 12/2002 | Kuroda et al. |
| 6,556,475 B2 | 4/2003 | Yamazaki et al. |
| 6,646,922 B2 | 11/2003 | Kato |
| 6,751,138 B2 | 6/2004 | Kuroda et al. |
| 6,818,942 B2 | 11/2004 | Tai et al. |
| 6,952,035 B2 | 10/2005 | Yoshida et al. |
| 6,965,142 B2 | 11/2005 | Diorio et al. |
| 7,002,830 B2 | 2/2006 | Kuroda et al. |
| 7,098,498 B2 | 8/2006 | Diorio et al. |
| 7,212,425 B2 | 5/2007 | Kuroda et al. |
| 7,313,026 B2 | 12/2007 | Shiba et al. |
| 7,335,557 B2 | 2/2008 | Yoshida et al. |
| 7,336,535 B2 | 2/2008 | Kuroda et al. |
| 7,466,599 B2 | 12/2008 | Shiba et al. |
| 7,489,005 B2 | 2/2009 | Tanaka |
| 7,519,930 B2 * | 4/2009 | Mori .................... 716/106 |
| 7,548,460 B2 | 6/2009 | Diorio et al. |
| 7,596,024 B2 | 9/2009 | Kato et al. |
| 7,709,307 B2 | 5/2010 | Kamath et al. |
| 7,961,515 B2 | 6/2011 | Kato et al. |
| 8,264,027 B2 | 9/2012 | Kamath et al. |
| 2005/0104119 A1 | 5/2005 | Diorio et al. |
| 2005/0277253 A1 | 12/2005 | Kato et al. |
| 2006/0050566 A1 | 3/2006 | Shiba et al. |
| 2007/0070707 A1 | 3/2007 | Yamamoto et al. |
| 2007/0122974 A1 | 5/2007 | Tanaka |
| 2007/0145458 A1 | 6/2007 | Asami |
| 2007/0221971 A1 | 9/2007 | Yamazaki et al. |
| 2007/0235794 A1 | 10/2007 | Yamazaki et al. |
| 2007/0278563 A1 | 12/2007 | Takano et al. |
| 2008/0048240 A1 | 2/2008 | Kamath et al. |
| 2008/0056011 A1 | 3/2008 | Shiba et al. |
| 2009/0154253 A1 | 6/2009 | Shiba et al. |
| 2012/0307569 A1 | 12/2012 | Kamath et al. |

FOREIGN PATENT DOCUMENTS

| | | |
|---|---|---|
| EP | 1 837 900 A2 | 9/2007 |
| EP | 1 892 753 A2 | 2/2008 |
| JP | 06-334195 A | 12/1994 |
| JP | 10-032268 A | 2/1998 |
| JP | 10-065031 A | 3/1998 |
| JP | 2000-315393 A | 11/2000 |
| JP | 2003-282749 A | 10/2003 |
| JP | 2004-165182 A | 6/2004 |
| JP | 2005-197624 A | 7/2005 |
| JP | 2005-533372 | 11/2005 |
| JP | 2006-013534 | 1/2006 |
| JP | 2006-080247 A | 3/2006 |
| JP | 2006-339554 A | 12/2006 |
| JP | 2007-123830 A | 5/2007 |
| JP | 2007-149943 A | 6/2007 |
| JP | 2007-201426 A | 8/2007 |
| JP | 2007-288176 | 11/2007 |
| JP | 2008-010842 A | 1/2008 |
| TW | 200818472 | 4/2008 |
| WO | WO-2004/006340 | 1/2004 |

OTHER PUBLICATIONS

Written Opinion (Application No. PCT/JP2009/058954; PCT11510) Dated Aug. 18, 2009.

Chinese Office Action (Application No. 200980118496.X PCTCN11510) Dated Jul. 3, 2013.

Taiwanese Office Action (Application No. 98116216) Dated Jun. 20, 2014.

\* cited by examiner

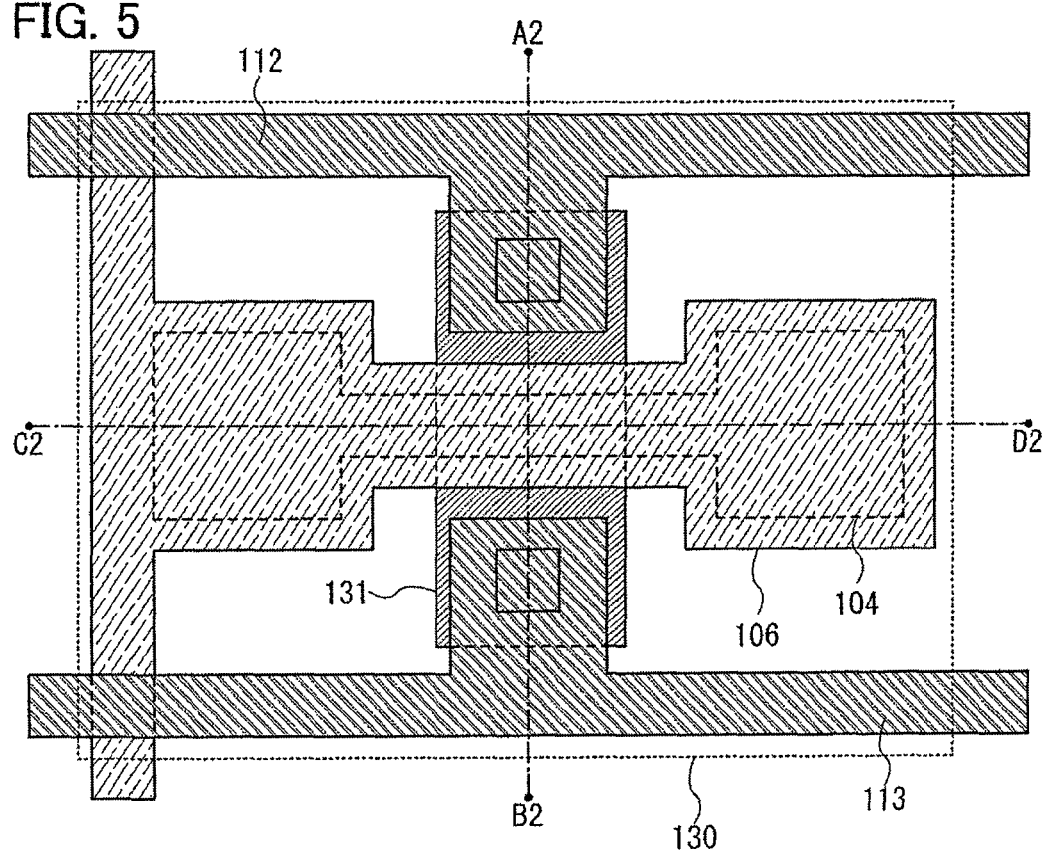

NONVOLATILE SEMICONDUCTOR MEMORY DEVICE AND MANUFACTURING METHOD THEREOF

TECHNICAL FIELD

The present invention relates to a nonvolatile semiconductor memory device (in particular, EEPROM (Electrically Erasable and Programmable Read Only Memory), or a flash memory) and a manufacturing method thereof.

BACKGROUND ART

Nonvolatile semiconductor memory devices (also referred to as nonvolatile memories) are utilized as recording media of various products such as digital cameras, portable audio players and cellular phones. Research and development of the nonvolatile semiconductor memory devices have been actively conducted to meet the various needs of the market, for example, further reduction in the size of the product, increase in recording capacity, increase in the response speed of recording and reading, and reduction in power consumption.

As one of the ways to meet the aforementioned needs of the market, in recent years, a nonvolatile memory of a so-called SOI (silicon on insulator) type has been actively developed, in which elements are formed using silicon (Si) that is provided over an insulating film.

The following methods and the like are known for forming an SOI substrate in an SOI nonvolatile memory: a method in which oxygen molecules are implanted from a silicon crystal surface by ion implantation, and then oxidation at a high temperature is performed, whereby an insulating film of silicon oxide is formed in the silicon crystal; and a method in which two silicon wafers are prepared, a portion used for separation by ion implantation is formed in one of the silicon wafers, the two silicon wafers are bonded to each other, and then, one of the silicon wafers is separated.

On the other hand, in order to achieve cost reduction, a structure in which a memory transistor is provided over a glass substrate or a plastic substrate has been proposed (e.g., patent document 1).

In a conventional memory transistor, an island-shaped semiconductor layer 601 formed of silicon, a first insulating film 602 (also referred to as a tunnel insulating film), a floating gate 603 (FG), a second insulating film 604, and a control gate 605 (CG) are stacked over a substrate 600, and the floating gate 603 is electrically insulated (floated). Further, a source line (SL) is electrically connected to one of impurity regions 606 and 607 which function as a source or a drain and are provided in the semiconductor layer 601, and a bit line (BL) is electrically connected to the other of the impurity regions 606 and 607 (see FIG. 11).

Further, in a nonvolatile memory using a floating gate, data is stored in accordance with the amount of charge accumulated in the floating gate 603. The floating gate 603 is electrically insulated; thus, voltage is indirectly applied between the semiconductor layer 601 and the floating gate 603 by using the control gate 605, whereby the memory transistor is operated.

When electrons are accumulated in the floating gate 603, voltage that has been applied to the control gate 605 is less likely to be applied between the semiconductor layer 601 and the floating gate 603 compared to the state where electrons are not accumulated; accordingly, the threshold value of the memory transistor apparently shifts in the positive direction. That is, by detecting the amount of charge accumulated in the floating gate 603 with change in the threshold value of the memory transistor, data stored in the memory transistor can be read out.

Here, if the impurity regions 606 and 607 of the semiconductor layer 601 have the same potential, the potential of the floating gate 603, $V_{FG}$, and a change in the threshold value of the memory transistor, $\Delta V tm$, can be represented by the following formula.

$$V_{FG} = \frac{C_2}{C_1 + C_2}(V_{CG} - \Delta V tm) \quad \text{[Formula (1)]}$$

$$\Delta V tm = -\frac{Q_{FG}}{C_2} \quad \text{[Formula (2)]}$$

In the formulas (1) and (2), $V_{CG}$ is the potential of the control gate 605; $C_1$, the capacitance between the semiconductor layer 601 and the floating gate 603; $C_2$, the capacitance between the floating gate 603 and the control gate 605; and $Q_{FG}$, the amount of electric charges in the floating gate 603. Note that $C_2/(C_1+C_2)$ in the formula (1) is generally referred to as a coupling ratio. As the coupling ratio increases, the ratio of the voltage applied between the semiconductor layer 601 and the floating gate 603 to the voltage applied to the control gate 605 increases.

When data is to be written to the memory transistor, high voltage of a positive polarity is applied to the control gate 605 by an F-N (Fowler-Nordheim) tunneling current or hot electrons so that a voltage is indirectly applied between the semiconductor layer 601 and the floating gate 603, whereby electrons are injected into the floating gate 603. On the other hand, when data is to be erased from the memory, a high voltage of a negative polarity is applied to the control gate 605 by an F-N (Fowler-Nordheim) tunneling current or the like so that a voltage is indirectly applied between the semiconductor layer 601 and the floating gate 603, whereby electrons are released from the floating gate 603. Thus, the voltage can be efficiently applied between the semiconductor layer 601 and the floating gate 603 by increasing the coupling ratio, so that a writing voltage and an erasing voltage can be reduced.

CITATION LIST

[Patent Document 1] Japanese Published Patent Application No. 2006-013534

DISCLOSURE OF INVENTION

In the memory transistor, when writing and erasing are repeatedly performed, exchange of electrons with the floating gate is repeatedly performed through a tunnel insulating film. As a result, the tunnel insulating film is deteriorated and characteristic deterioration of the memory transistor is generated by increase of an interface state density between the semiconductor layer and the tunnel insulating film, increase of an interface state density between the tunnel insulating film and the floating gate, charge injection to the tunnel insulating film, generation of traps, and the like. For example, by performing writing and erasing repeatedly, there is a possibility that a device parameter such as mutual conductance (gm) representing ON characteristics decreases and reading error occurs.

In view of the aforementioned problems, it is an object of an embodiment of the present invention to suppress the reading error even in the case where writing and erasing are repeatedly performed. Further, it is another object of an embodiment of the present invention to reduce writing voltage and erasing voltage while increase in the area of the memory transistor is suppressed.

In one embodiment of the present invention, a floating gate and a control gate are provided with an insulating film interposed therebetween over a first semiconductor layer for writing operation and erasing operation and a second semiconductor layer for reading operation which are provided over a substrate; injection and release of electrons to and from the floating gate are performed using the first semiconductor layer; and reading is performed using the second semiconductor layer.

One embodiment of the present invention is to provide a nonvolatile semiconductor memory device including: a first semiconductor layer which has impurity regions; a second semiconductor layer which has a source region and a drain region; a first insulating film which is provided over the first semiconductor layer and the second semiconductor layer; a floating gate which is provided over the first insulating film and which overlaps with the first semiconductor layer and the second semiconductor layer; a second insulating film which is provided over the floating gate; a control gate which is provided over the second insulating film and which overlaps with the first semiconductor layer, the second semiconductor layer, and the floating gate; a first conductive film which is electrically connected to the impurity regions provided in the first semiconductor layer; a second conductive film which is electrically connected to one of the source region and the drain region provided in the second semiconductor layer; and a third conductive film electrically connected to the other of the source region and the drain region.

Further, one embodiment of the present invention can have a structure in which the impurity regions are provided apart in two regions of the first semiconductor layer with the control gate interposed therebetween, and the first conductive film is electrically connected both of the impurity regions which are provided apart from each other.

In one embodiment of the present invention, the first semiconductor layer is a semiconductor layer for writing operation and erasing operation and the second semiconductor layer is a semiconductor layer for reading operation.

A semiconductor layer (the first semiconductor layer) for writing operation and erasing operation is a semiconductor layer in which an exchange of electrons with the floating gate (injection of electrons to the floating gate, and release of electrons from the floating gate) is performed through a tunnel insulating film (the first insulating film).

A semiconductor layer (the second semiconductor layer) for reading operation is a semiconductor layer that is used for detecting the amount of charge accumulated in the floating gate, specifically, a semiconductor layer that has source, drain, and channel regions for reading out the amount of charge in the floating gate as the amount of change in the threshold value and includes a transistor. In addition, it is preferable that the nonvolatile semiconductor memory device be operated so that the exchange of electrons is not performed between the second semiconductor layer and the floating gate when writing operation and erasing operation are performed.

Further, one embodiment of the present invention has a structure in which potential applied to the second conductive film, the third conductive film, and the control gate is controlled so that an F-N tunneling current is not generated between the second semiconductor layer and the floating gate when writing operation and erasing operation are performed. Preferably, the embodiment of the present invention has a structure in which the same potential is applied to the second conductive film, the third conductive film, and the control gate when the writing operation and erasing operation are performed. That is, one embodiment of the present invention has a structure in which the same potential is applied to the second semiconductor layer and the control gate.

One embodiment of the present invention comprises the steps of forming a first semiconductor layer and a second semiconductor layer over a substrate; forming a first insulating film over the first semiconductor layer and the second semiconductor layer; forming a floating gate over the first insulating film so as to overlap with the first semiconductor layer and the second semiconductor layer; forming a second insulating film over the floating gate; forming a control gate so as to overlap with the first semiconductor layer, the second semiconductor layer, and the floating gate; adding an impurity element to the first semiconductor layer and the second semiconductor layer using the control gate as a mask to form impurity regions in the first semiconductor layer and form a source region and a drain region in the second semiconductor layer; and forming a first conductive film electrically connected to the impurity regions, a second conductive film electrically connected to one of the source region and the drain region, and a third conductive film electrically connected to the other of the source region and the drain region.

According to one embodiment of the present invention, by providing each of the semiconductor layer for writing operation and erasing operation, and the semiconductor layer for reading operation, even in the case where writing and erasing are repeatedly performed, reading error can be suppressed. In addition, according to one embodiment of the present invention, the semiconductor layer for reading operation function as a control gate when writing operation and erasing operation are performed, so that the coupling ratio is increased, whereby writing voltage and erasing voltage can be reduced while increase in the area of a memory transistor is controlled.

BRIEF DESCRIPTION OF DRAWINGS

FIG. 5 illustrates a nonvolatile semiconductor memory device of a comparative example;

BEST MODE FOR CARRYING OUT THE INVENTION

Figure 1A:
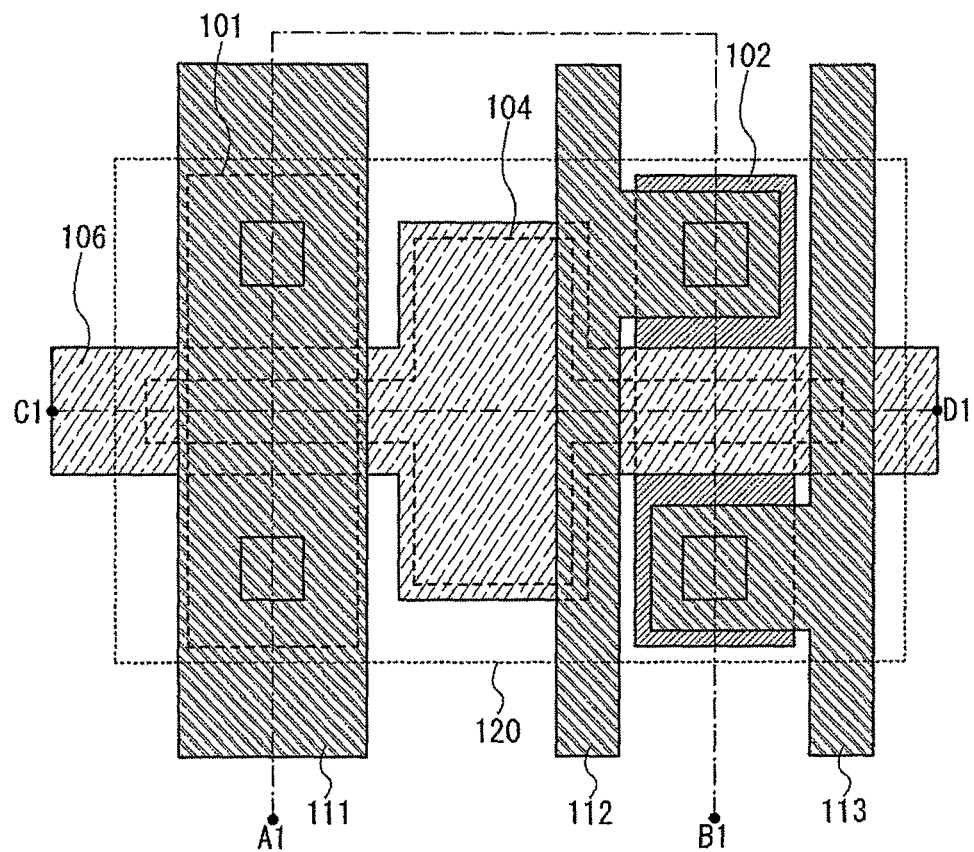
FIGS. 1A and 1B illustrate a nonvolatile semiconductor memory device.

Embodiments of the present invention will be described with reference to the drawings. However, the present invention is not limited to the following description, and various changes and modifications for the modes and details thereof will be apparent to those skilled in the art unless such changes and modifications depart from the spirit and scope of the invention. Therefore, the present invention should not be interpreted as being limited to what is described in the embodiments described below. Note that in the description of the invention, the identical portions are denoted by the identical reference numerals in some cases.

Embodiment 1

Figure 1B:
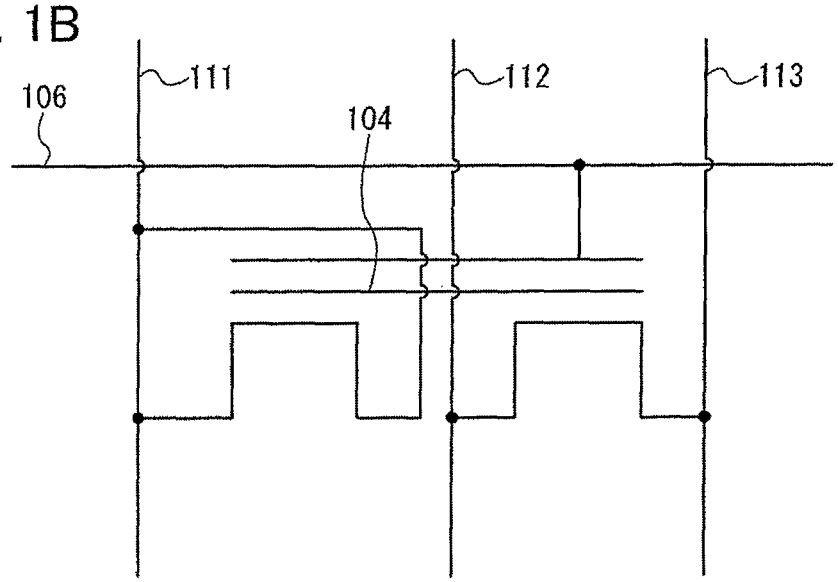
Figure 2A:
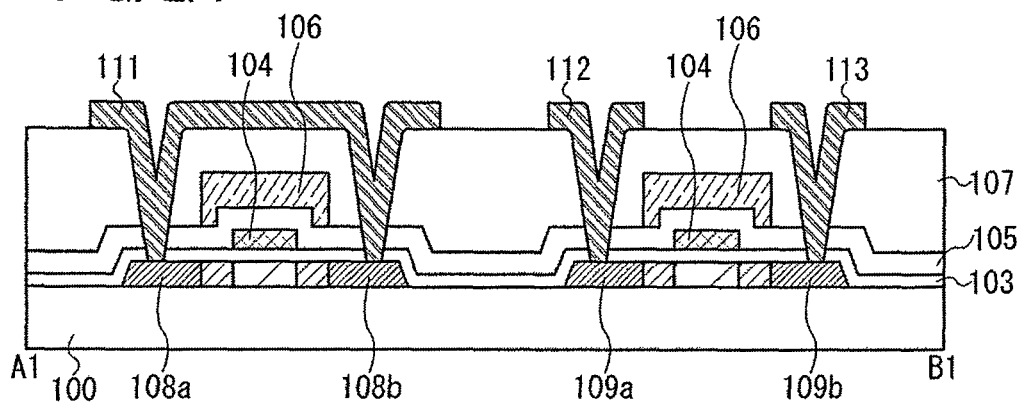
FIGS. 2A and 2B illustrate a nonvolatile semiconductor memory device.
Figure 2B:
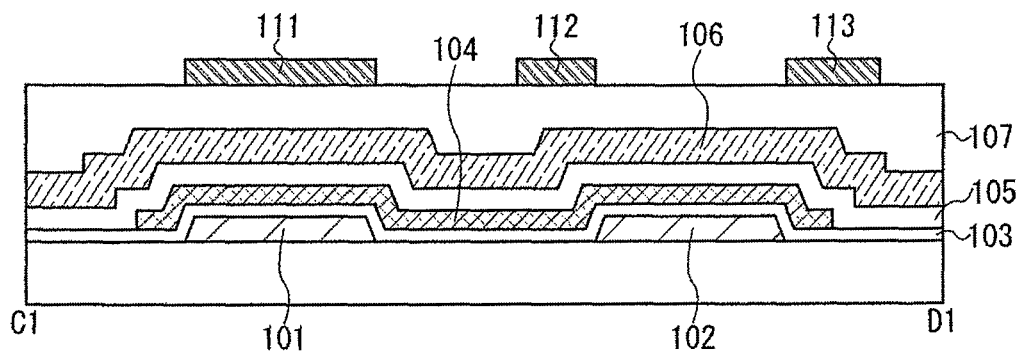

This embodiment describes an example of a nonvolatile semiconductor memory device with reference to drawings. Note that FIG. 1A illustrates a top view of a memory transistor constituting part of nonvolatile semiconductor memory device, and FIG. 1B illustrates an equivalent circuit diagram of the memory transistor in FIG. 1A. Further, FIG. 2A corresponds to a cross section taken along a line A1-B1 in FIG. 1A, and FIG. 2B corresponds to a cross section taken along a line C1-D1 in FIG. 1A.

A nonvolatile semiconductor memory device illustrated in this embodiment includes a memory transistor 120 provided over a substrate 100, which functions as a memory by performing operation of writing, erasing, or reading data on the memory transistor 120.

The memory transistor 120 includes a first semiconductor layer 101 and a second semiconductor layer 102 provided over a substrate 100, a floating gate 104 provided above the first semiconductor layer 101 and the second semiconductor layer 102 with a first insulating film 103 interposed therebetween, and a control gate 106 provided above the floating gate 104 with a second insulating film 105 interposed therebetween. Further, a first conductive film 111 is electrically connected to the first semiconductor layer 101, and a second conductive film 112 and a third conductive film 113 are electrically connected to the second semiconductor layer 102.

The first semiconductor layer 101 is used when writing operation and erasing operation on the memory transistor 120 (injection and release of electrons to and from the floating gate 104) are performed. The second semiconductor layer 102 is used when reading operation from the memory transistor 120 is performed.

The floating gate 104 is provided so as to overlap with part of the first semiconductor layer 101 and the second semiconductor layer 102, and electrically insulated (floated).

The control gate 106 is provided so as to overlap with the first semiconductor layer 101, the second semiconductor layer 102 and the floating gate 104. In addition, the control gate 106 functions as a word line. Note that, in FIGS. 1A and 1B, the control gate 106 is provided so as to overlap with part of the first semiconductor layer 101 and the second semiconductor layer 102, and to overlap with the entire floating gate 104; however, the structure is not limited thereto, and the control gate 106 may be provided so as to overlap with part of the floating gate 104.

The first conductive film 111 is provided so as be electrically connected to impurity regions provided in the first semiconductor layer 101. In FIGS. 1A and 1B and 2A and 2B, a structure is shown in which two impurity regions 108a and 108b which are spaced apart in the first semiconductor layer 101 with the control gate 106 interposed therebetween are electrically connected to the first conductive film 111. As illustrated in FIGS. 1A and 1B, by electrically connecting the first conductive film 111 and two impurity regions which are spaced apart in the first semiconductor layer 101, the potential of the first conductive film 111 can be easily transmitted to the first semiconductor layer 101. The first conductive film 111 functions as a rewriting line which supplies electrons to the floating gate when writing operation is performed on the memory and releases the electrons from the floating gate when erasing operation is performed.

Furthermore, as illustrated in FIGS. 1A and 1B, by providing the first conductive film 111 so as to overlap with the first semiconductor layer 101, the area of the memory transistor can be reduced. However, the structure is not limited thereto.

The second conductive film 112 and the third conductive film 113 are electrically connected to impurity regions which are spaced apart in the second semiconductor layer 102, respectively. In FIGS. 1A and 1B, and FIGS. 2A and 2B, one of the impurity regions spaced apart in the second semiconductor layer 102 with the control gate 106 interposed therebetween (an impurity region 109a) is electrically connected to the second conductive film 112, and the other (an impurity region 109b) is electrically connected to the third conductive film 113. Note that the impurity regions 109a and 109b each functions as a source region or a drain region. In addition, one of the second conductive film 112 and the third conductive film 113 functions as a source line, and the other functions as a bit line. Other memory transistors or selection transistors may be provided between the source line and the second semiconductor layer 102 or between the bit line and the second semiconductor layer 102.

In this embodiment, a plurality of semiconductor layers (here, two semiconductor layers) is provided for one memory transistor 120. The writing operation and erasing operation (injection and release of electrons to and from the floating gate 104) are performed using one of the semiconductor layers (the first semiconductor layer 101 in FIGS. 1A and 1B), and the reading operation is performed using the other semiconductor layer (the second semiconductor layer 102 in FIGS. 1A and 1B). In that case, the electrons are injected and released through the first insulating film 103 (tunnel insulating film) which locates between the first semiconductor layer 101 and the floating gate 104 when writing operation and erasing operation are performed; thus, deterioration of the first insulating film 103 which locates between the second semiconductor layer 102 and the floating gate 104 can be suppressed. As a result, reading error associated with the deterioration of the first insulating film 103 can be suppressed even where the writing operation and erasing operation are repeatedly performed.

Figure 7A:
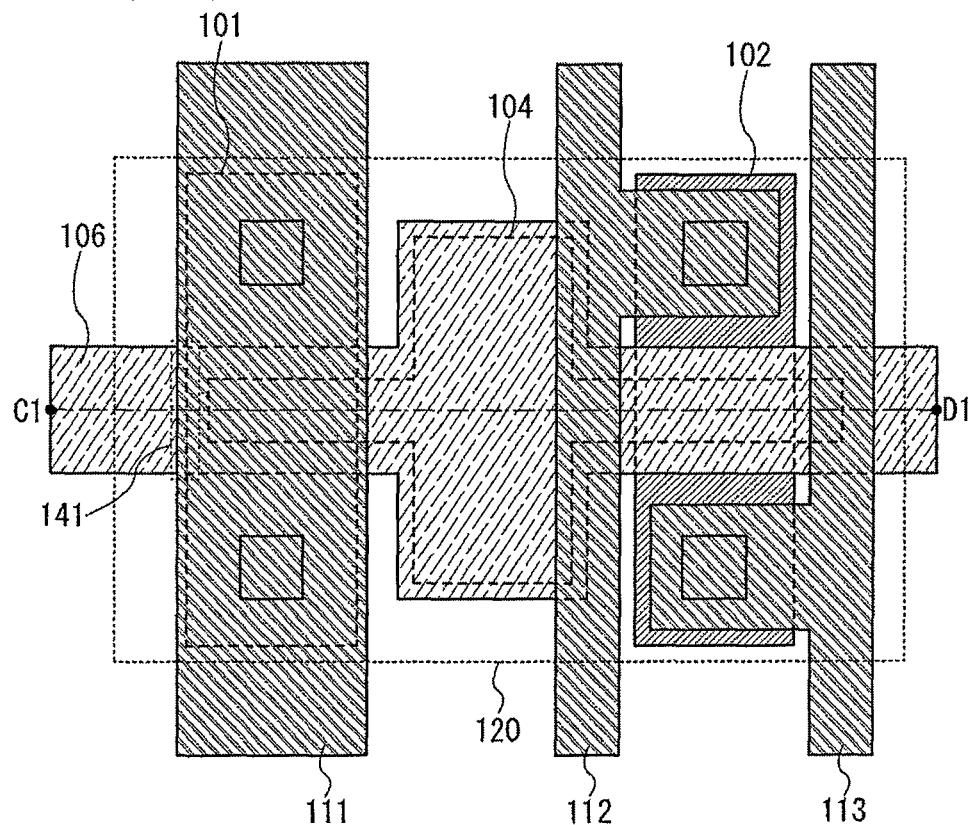
FIGS. 7A and 7B illustrate a nonvolatile semiconductor memory device.
Figure 7B:
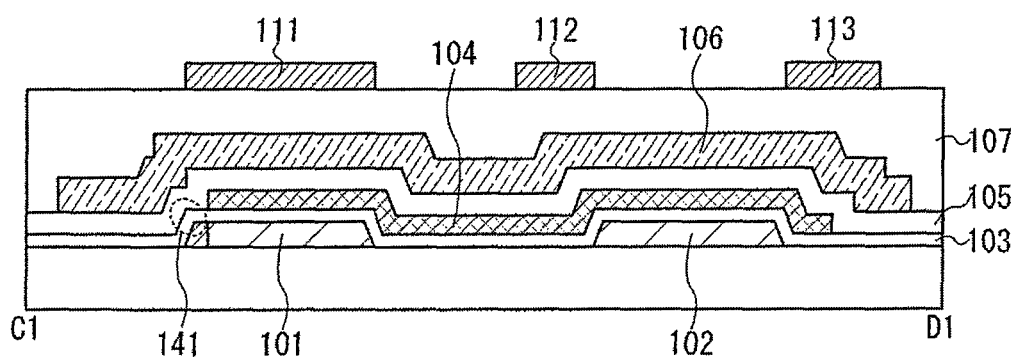

Furthermore, the memory transistor illustrated in this embodiment may be provided so that an edge of the floating gate 104 is placed over the first semiconductor layer 101 (so that the floating gate 104 does not overlap with an edge 141 of the first semiconductor layer 101) in the C1-D1 direction of FIG. 1A (see FIGS. 7A and 7B).

An electric field may be concentrated in the edge 141 of the first semiconductor layer 101 for writing operation or erasing operation and the edge 141 may be short-circuited when writing operation and erasing operation are performed. Therefore, as illustrated in FIGS. 7A and 7B, by placing the edge of the floating gate 104 over the first semiconductor layer 101, a risk of short circuits at the edge of the first semiconductor layer 101 can be reduced, and a yield can be improved.

On the other hand, as for the second semiconductor layer 102, the floating gate 104 is preferably provided so as to overlap with both edges of the second semiconductor layer 102. The second semiconductor layer 102 is used for reading; thus, short circuits due to the concentration of an electric field at the edges of the second semiconductor layer 102 are less likely to occur. Further, by providing the floating gate 104 so as to overlap with the edges of the second semiconductor layer 102, formation of a parasitic transistor can be controlled and distinction between a writing state and an erasing state can be preferably performed.

Then, an operation method (writing operation, erasing operation, or reading operation) of the memory transistor illustrated in this embodiment is described. Note that the voltage used in performing writing operation, erasing operation, or reading operation which will be illustrated in the following description is an example, and is not limited thereto. The voltage to be used may be selected by a practitioner as appropriate.

When writing operation is performed, for example, a voltage of +6 V is applied to the control gate 106; a voltage of −6 V is applied to the first conductive film 111; a voltage of +6 V is applied to the second conductive film 112; and a voltage of +6 V is applied to the third conductive film 113. In this case, an F-N tunneling current is generated between the first semiconductor layer 101 and the floating gate 104, whereby electrons are injected into the floating gate 104 through the first insulating film 103 which is placed over the first semiconductor layer 101.

When erasing operation is performed, for example, a voltage of −7 V is applied to the control gate 106; a voltage of +7 V is applied to the first conductive film 111; a voltage of −7 V is applied to the second conductive film 112; and a voltage of −7 V is applied to the third conductive film 113. In this case, an F-N tunneling current is generated between the first semiconductor layer 101 and the floating gate 104, whereby electrons are released from the floating gate 104 through the first insulating film 103 which is placed over the first semiconductor layer 101.

When reading operation is performed, a voltage of +3 V is applied to the control gate 106; a voltage of 0 V is applied to the first conductive film 111; a voltage of 0 V is applied to the second conductive film 112; and a voltage of +1.5 V is applied to the third conductive film 113. In this case, if the memory transistor is in a writing state in which a threshold value of the memory transistor is higher than the voltage applied to the control gate 106, the memory transistor is turned off, and if the memory transistor is in an erasing state in which a threshold value of the memory transistor is low, the memory transistor is turned on and data recorded as a threshold value of the memory transistor can be read out.

Note that when writing operation and erasing operation are performed, the same potential is applied to the second conductive film 112, the third conductive film 113, and the control gate 106 so that the second semiconductor layer 102 for reading has the same potential as that of the control gate 106. In this case, the injection and release of electrons to and from the floating gate 104 are selectively performed through the first insulating film 103 which locates between the first semiconductor layer 101 and the floating gate 104, whereby deterioration of the first insulating film 103 placed between the second semiconductor layer 102 and the floating gate 104 can be suppressed.

By setting the second semiconductor layer 102 for reading to be the same potential as that of the control gate 106 when writing operation and erasing operation are performed, the second semiconductor layer 102 for reading can function as a control gate only when writing operation and erasing operation are performed. As a result, the capacitance of $C_2$ in the above formula (1) can be increased and coupling ratio can be increased.

The increase of the coupling ratio will be specifically described using a formula below.

When the potential of the first semiconductor layer 101 which performs writing operation and erasing operation is set to be 0, and the potential of the source region (here, the impurity region 109a) and the drain region (here, the impurity region 109b) in the second semiconductor layer 102 for reading is set to be the same, the potential $V_{FG}$ of the floating gate 104 is represented by the following formula.

$$V_{FG} = \frac{C_2 \cdot V_{CG} + C_{12} \cdot V_{SD} + Q_{FG}}{C_{11} + C_{12} + C_2} \quad [\text{Formula (3)}]$$

In the formula (3), $V_{CG}$ denotes the potential of the control gate 106; $V_{SD}$, the potential of the second semiconductor layer 102 for reading in which the potential of the source region (impurity region 109a) and the drain region (impurity region 109b) is set to be the same; $C_{11}$, the capacitance between the first semiconductor layer 101 for writing and erasing and the floating gate 104; $C_{12}$, the capacitance between the second semiconductor layer 102 for reading and the floating gate 104; $C_2$, the capacitance between the floating gate 104 and the control gate 106; and $Q_{FG}$, the amount of electric charges in the floating gate 104. At this time, in the formula (3), when the $V_{SP}$, the potential of the second semiconductor layer 102 for reading is set to be the same as $V_{CG}$, the potential of the control gate 106, $V_{FG}$, the potential of the floating gate 104 is represented by the following formula.

$$V_{FG} = \frac{C_2 + C_{12}}{C_{11} + C_{12} + C_2}\left(V_{CG} + \frac{Q_{FG}}{C_2 + C_{12}}\right) \quad [\text{Formula (4)}]$$

In the formula (4), the coupling ratio is $(C_2+C_{12})/(C_{11}+C_{12}+C_2)$.

Figure 6A:
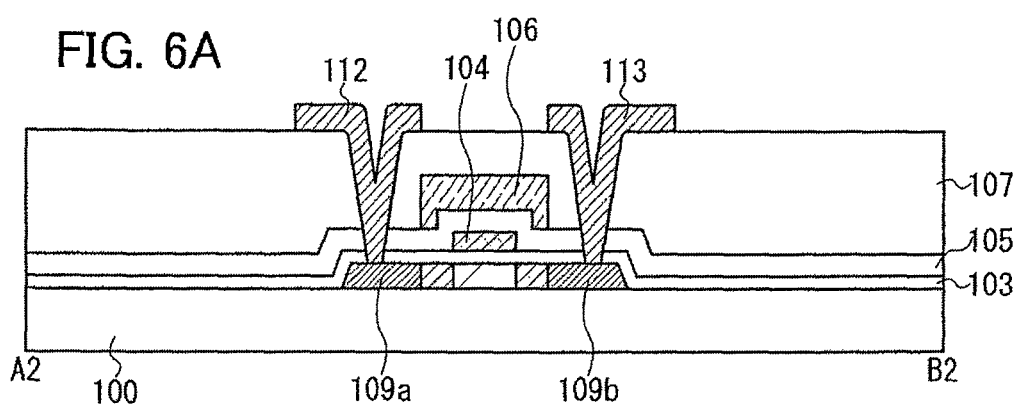
FIGS. 6A and 6B illustrate a nonvolatile semiconductor memory device of a comparative example.
Figure 6B:
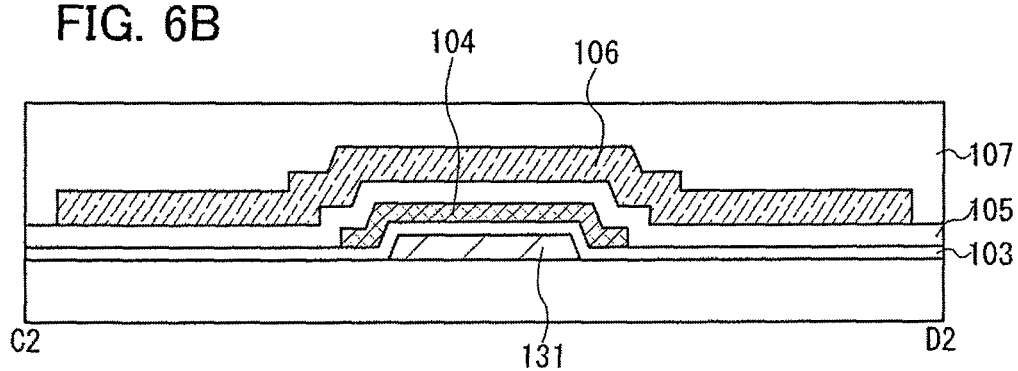

Here, the memory transistor 120 including two semiconductor layers (see FIGS. 1A and 1B and FIGS. 2A and 2B) is compared with a memory transistor 130 only including one semiconductor layer (see FIG. 5 and FIGS. 6A and 6B). Note that FIG. 5 is a top view of the memory transistor 130 only including a semiconductor layer 131; FIG. 6A corresponds to a cross section taken along a line A2-B2 in FIG. 5; and FIG. 6B is a cross section taken along a line C2-D2 in FIG. 5. In addition, writing operation, erasing operation, and reading operation are performed in the semiconductor layer 131 illustrated in FIG. 5 and FIGS. 6A and 6B.

In the case where the area of the floating gate 104 is the same in the memory transistor 120 illustrated in FIGS. 1A and 1B and FIGS. 2A and 2B and in the memory transistor 130 illustrated in FIG. 5 and FIGS. 6A and 6B, the coupling ratio is $(C_2+C_{12})/(C_{11}+C_{12}+C_2)$ because the capacitance $C_{12}$ is added in the memory transistor 120 in FIGS. 1A and 1B and FIGS. 2A and 2B. When the coupling ratios of the memory transistor 120 and the memory transistor 130 are compared, $(C_2+C_{12})/(C_{11}+C_{12}+C_2) > C_2/(C_1+C_2)$ is obtained, that is, the coupling ratio of the memory transistor 120 is higher than that of the memory transistor 130.

Furthermore, the first insulating film 103 between the second semiconductor layer 102 and the floating gate 104 is formed to be thinner than the second insulating film 105; thus, the capacitance $C_{12}$ per unit area can be increased and the coupling ratio can be efficiently increased. Therefore, in the case where the memory transistor 120 illustrated in FIGS. 1A and 1B and FIGS. 2A and 2B and the memory transistor 130 illustrated in FIG. 5 and FIGS. 6A and 6B are provided so that the coupling ratios thereof are the same, the area where the floating gate 104 and the control gate 106 overlap with each other can be reduced because the capacitance $C_2$ between the floating gate 104 and the control gate 106 can be small in the memory transistor 120.

Accordingly, even when the first semiconductor layer 101 and the second semiconductor layer 102 are provided (a plurality of island-shaped semiconductor layers are provided) as illustrated in FIGS. 1A and 1B and FIGS. 2A and 2B, the area occupied by the memory transistor can be approximately the same as or reduced compared to the conventional structure because the area of the floating gate 104 can be reduced.

Note that as a preferable example in the operation method of the above-described memory transistor, an example is illustrated in which the same potential is applied to the second conductive film 112, the third conductive film 113, and the control gate 106, in writing operation and erasing operation; however, this embodiment is not limited thereto. If the potential with which an F-N tunneling current is not generated between the second semiconductor layer 102 and the floating gate 104 is applied, the potential to be applied to the second conductive film 112, the third conductive film 113, and the control gate 106 in writing operation and erasing operation is not necessarily the same. For example, when the film thickness of the first insulating film 103 is 10 nm, the potential may be applied between the second semiconductor layer 102 and the control gate 106 so that the electric field between the second semiconductor layer 102 and the floating gate 104 is 6 MV/cm or less.

As described, by controlling the potential applied to the second conductive film 112, the third conductive film 113, and the control gate 106 so that the F-N tunneling current is not generated between the second semiconductor layer 102 and the floating gate 104 in writing operation and erasing operation, deterioration of the first insulating film 103 placed between the second semiconductor layer 102 and the floating gate 104 can be controlled.

Note that the memory transistor illustrated in this embodiment can be implemented in combination with other embodiments of this specification.

Embodiment 2

This embodiment describes an example of a method for manufacturing a memory transistor constituting part of the nonvolatile semiconductor memory device described in the above embodiment with reference to drawings. Note that the FIGS. 3A to 3F correspond to a cross section taken along a line A1-B1 in FIG. 1A, and FIGS. 4A to 4D corresponds to a cross section taken along a line C1 to D1 in FIG. 1A.

Figure 3A:
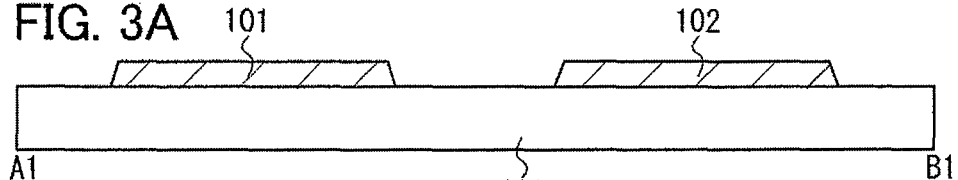
FIG. 3A to 3F illustrate a method for manufacturing a nonvolatile semiconductor memory device.
Figure 4A:
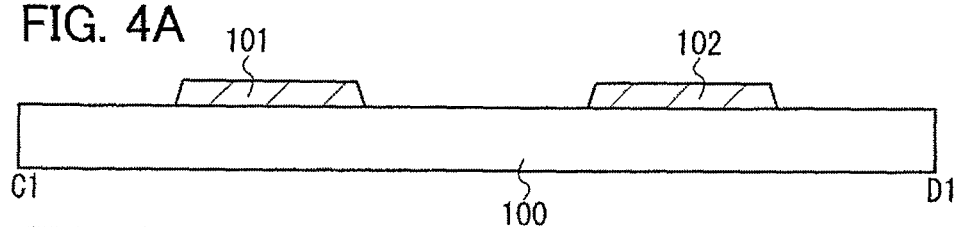
FIG. 4A to 4D illustrate a method for manufacturing a nonvolatile semiconductor memory device.

First, the first semiconductor layer 101 and the second semiconductor layer 102, each of which has an island shape, are formed over the substrate 100 (see FIGS. 3A and 4A).

A substrate having an insulating surface, for example, a glass substrate, a quartz substrate, a ceramic substrate, a plastic substrate, or the like can be used as the substrate 100. Further, an insulating film formed of one layer or a plurality of layers may be provided over the surface of the substrate 100 and the first semiconductor layer 101 and the second semiconductor layer 102 may be formed over the insulating film.

The insulating film formed of one layer or a plurality of layers is formed using an insulating material such as silicon oxide, silicon nitride, silicon oxynitride ($SiO_xN_y$, x>y), silicon nitride oxide ($SiN_xO_y$) (x>y), or the like. There is no particular limitation on a method for forming the insulating film, and a CVD method, a sputtering method, or the like can be used. The provision of the insulating film over the substrate 100 can reduce the influence of the roughness of the substrate 100 and prevent impurities in the substrate 100 from diffusing into an element formed over the insulating film.

The first semiconductor layer 101 and the second semiconductor layer 102 are formed using a material mainly containing silicon (Si) (e.g., Si, $Si_xGe_{1-x}$ etc.) by a CVD method, a sputtering method, or the like. Note that the first semiconductor layer 101 and the second semiconductor layer 102 may be any of an amorphous semiconductor, a microcrystalline semiconductor, a polycrystalline semiconductor, and a single crystal semiconductor, and the crystalline state can be appropriately selected in accordance with the purpose. After forming a semiconductor film which has a crystalline state in accordance with the purpose, a plurality of island-shaped semiconductor layers can be formed by selectively etching the semiconductor film. In addition, the first semiconductor layer 101 is not limited to a semiconductor, and may be a conductive film.

For example, after forming an amorphous semiconductor film to have a film thickness of 30 nm to 200 nm over the substrate 100 with an insulating film interposed therebetween, and crystallizing the amorphous semiconductor film, the first semiconductor layer 101 and the second semiconductor layer 102 are formed by selective etching.

As a crystallization method of the semiconductor film, a laser crystallization method, a thermal crystallization method using rapid thermal annealing (RTA) or an annealing furnace, a thermal crystallization method using a metal element for promoting crystallization, a method combining these methods; or the like can be used.

Alternatively, the first semiconductor layer 101 and the second semiconductor layer 102 may be a single crystal semiconductor (e.g., single crystal silicon) using an SOI substrate.

A single crystal semiconductor layer can be formed in the following manner: oxygen molecules are implanted from a silicon crystal surface by ion implantation, and then oxidation at a high temperature is performed, whereby an insulating film of silicon oxide is formed in the silicon crystal. Alternatively, a single crystal semiconductor layer can be formed in the following manner: two silicon wafers are prepared; a portion used for separation by ion implantation is formed in one of the silicon wafers; the two silicon wafers are bonded to each other; and the one of the silicon wafers is separated.

Figure 3B:
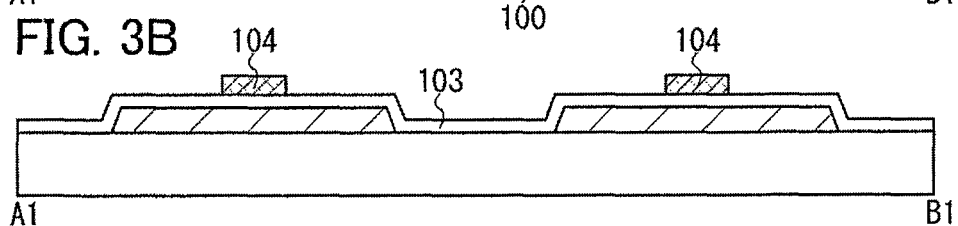
Figure 4B:
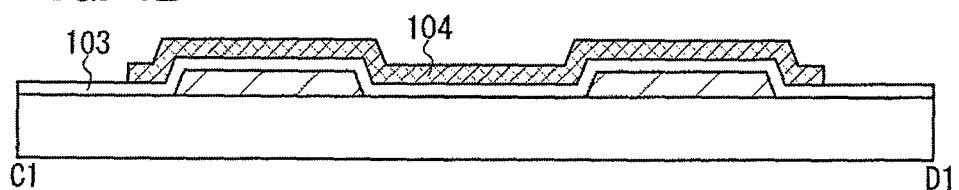

Then, after forming the first insulating film 103 over the first semiconductor layer 101 and the second semiconductor layer 102, the floating gate 104 is formed over the first insulating film 103 (see FIGS. 3B and 4B). Note that the edge of the floating gate 104 may be provided above the first semiconductor layer 101.

An insulating film including at least oxygen is formed as the first insulating film 103. For example, the first insulating film 103 is formed of silicon oxide, silicon oxynitride, silicon nitride oxide, aluminum oxide ($Al_xO_y$), tantalum oxide ($TaO_x$), or the like. In addition, a material with high dielectric constant such as hafnium oxide ($HfO_x$) can be used. The first insulating film 103 can be formed by a CVD method, a sputtering method, or the like. Further, an oxide film may be formed on the surface of the semiconductor layer by performing plasma treatment on the semiconductor layer in an oxygen atmosphere.

For example, a silicon oxide film or a silicon oxynitride film which has a film thickness of from 1 nm to 20 nm inclusive, preferably, from 7 nm to 10 nm inclusive is formed as the first insulating film 103.

In the case where a silicon oxynitride film is formed as the first insulating film 103, the first insulating film 103 can be formed by a plasma CVD method using a silane ($SiH_4$) gas and a dinitrogen monoxide ($N_2O$) gas as a source gas. An example of conditions of forming the silicon oxynitride film at this time is shown below.

The gas mass flow ratio of the source gas is set to $SiH_4$:$N_2O$=1:800 (sccm), for example. The gas mass flow ratio in this specification refers to a ratio of gas mass flow rate (sccm) between the $SiH_4$ gas and the $N_2O$ gas which are supplied to a film-forming chamber. The high-frequency power is set to 150 W at a frequency of 60 MHz, the film-forming temperature (substrate temperature) is set to 400° C., the pressure in the process chamber is set to 40 Pa, and the electrode interval is set to 28 mm.

After the first insulating film 103 is formed, the first insulating film 103 may be subjected to plasma oxidation. The plasma oxidation is performed using plasma which is excited by a high frequency wave such as by microwave (typically, 2.45 GHz) and which has an electron density of $1\times10^{11}$ cm$^{-3}$ or more and a plasma electron temperature of 1.5 eV or less. Specifically, plasma with an electron density of $1\times10^{11}$ cm$^{-3}$ to $1\times10^{13}$ cm$^{-3}$ inclusive and a plasma electron temperature of 0.5 eV to 1.5 eV inclusive is preferably used. Moreover, the plasma oxidation time performed on the first insulating film 103 is preferably 60 seconds or longer. For example, plasma treatment is performed on the semiconductor layer in an oxygen atmosphere; a silicon oxynitride film is formed by a plasma CVD method; and plasma treatment is performed again in an oxygen atmosphere, whereby the first insulating film 103 can be formed.

The floating gate 104 can be formed using an element selected from tantalum (Ta), tungsten (W), titanium (Ti), molybdenum (Mo), aluminum (Al), copper (Cu), chromium (Cr), niobium (Nb), and the like, or an alloy or a compound material containing any of these elements as its main component, in a single-layer structure or a stacked structure. In addition, a metal nitride film obtained by nitriding these elements can be used. Besides, the floating gate 104 may be formed using a semiconductor material typified by polycrystalline silicon doped with an impurity element such as phosphorus or the like. The floating gate 104 can be formed by forming a film using these materials by CVD method, a sputtering method, or the like to have a thickness of 1 nm to 200 nm, and patterning the film into a desired shape.

Figure 3C:
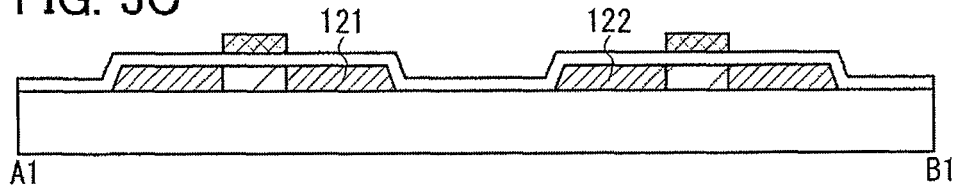

Subsequently, using the floating gate 104 as a mask, an impurity element is added to the first semiconductor layer 101 and the second semiconductor layer 102, thereby forming impurity regions 121 and 122 (see FIG. 3C).

The impurity regions 122 formed in the second semiconductor layer 102 for reading function as an LDD (lightly doped drain) of a transistor. As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used. Here, phosphorus (P) is added as the impurity element.

Here, the impurity regions 121 having a lower impurity concentration than the impurity regions 108a and 108b to be formed later are formed in the first semiconductor layer 101, and the impurity regions 122 having a lower impurity concentration than the impurity regions 109a and 109b to be formed later are formed in the second semiconductor layer 102; however, the impurity regions 121 and 122 are not necessarily formed. When the impurity regions 122 are not formed, a memory transistor is likely to have a structure provided with an offset control gate; thus, excessive erasing of the memory is prevented, and the memory transistor that is in an erasing state can be kept in a normally off state. As described in this embodiment, by forming the impurity regions 122 as LDD regions, the resistance to hot electrons and ON characteristics of the memory transistor can be improved.

Figure 3D:
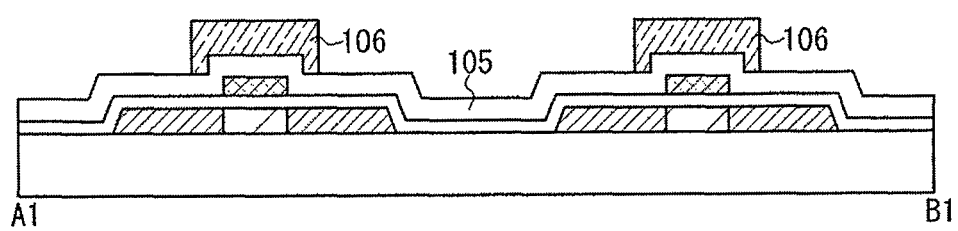
Figure 4C:
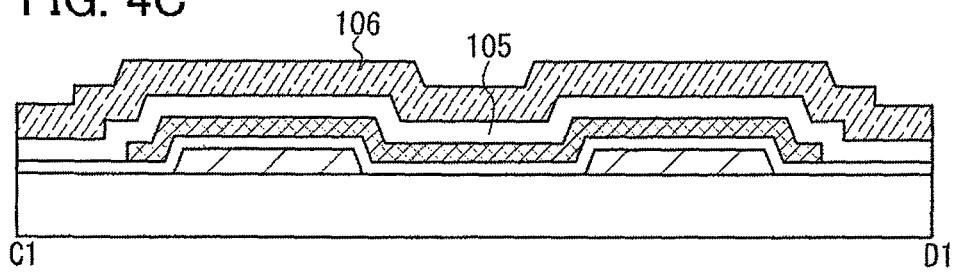

Then, after forming the second insulating film 105 to cover the floating gate 104, the control gate 106 is formed over the second insulating film 105 (see FIG. 3D and FIG. 4C).

As the second insulating film 105, an insulating film containing oxygen or nitrogen, such as silicon oxide, silicon nitride, silicon oxynitride, or a silicon nitride oxide, can be formed by a CVD method, a sputtering method, a coating method or the like. The film thickness of the second insulating film 105 is preferably 10 nm to 100 nm inclusive, and more preferably 20 nm to 50 nm inclusive.

The control gate 106 can be formed using an element selected from tantalum (Ta), tungsten (W), titanium (Ti), molybdenum (Mo), aluminum (Al), copper (Cu), chromium (Cr), niobium (Nb), and the like, or an alloy or a compound material containing any of these elements as its main component, in a single-layer structure or a stacked structure. In addition, a metal nitride film obtained by nitriding these elements can be used. Besides, the control gate 106 may be formed by forming a film using a semiconductor material typified by polycrystalline silicon doped with an impurity element such as phosphorus or the like by a CVD method, a sputtering method, or the like and patterning the film into a desired shape. The control gate 106 can be formed using these materials by a CVD method, a sputtering method, or the like to have a thickness of 100 nm to 400 nm.

In addition, as illustrated in FIG. 3D and FIG. 4C, by forming the control gate 106 so as to cover side surfaces of the floating gate 104, capacitance is generated at the side surfaces of the floating gate 104 and the side surfaces of the control gate 106, and writing voltage can be reduced.

Furthermore, the bottom surface of the floating gate 104 is covered with the first insulating film 103, and the top and side surfaces thereof are covered with the second insulating film 105. Thus, the charge accumulated in the floating gate 104 can be easily retained, and retention characteristics of the memory can be improved. In the case where a substrate having low heat resistance such as a glass substrate is used as the substrate 100, heat treatment at approximately 600° C. or lower can only be used; therefore, a smaller number of insulating films surrounding the floating gate 104 with a simpler element structure are preferably used in terms of retention characteristics.

Figure 3E:
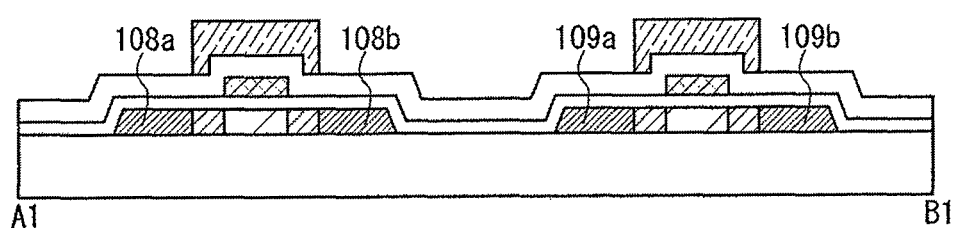

Next, an impurity element is added to the first semiconductor layer 101 and the second semiconductor layer 102 using the control gate 106 as a mask, thereby forming the impurity regions 108a and 108b, and the impurity regions 109a and 109b each serving as a source or a drain (see FIG. 3E).

As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used. Here, phosphorus (P) is added as the impurity element. At this time, the impurity regions 108a and 108b, and the impurity regions 109a and 109b are formed to have higher impurity concentration than the impurity regions 121 and 122.

Figure 3F:
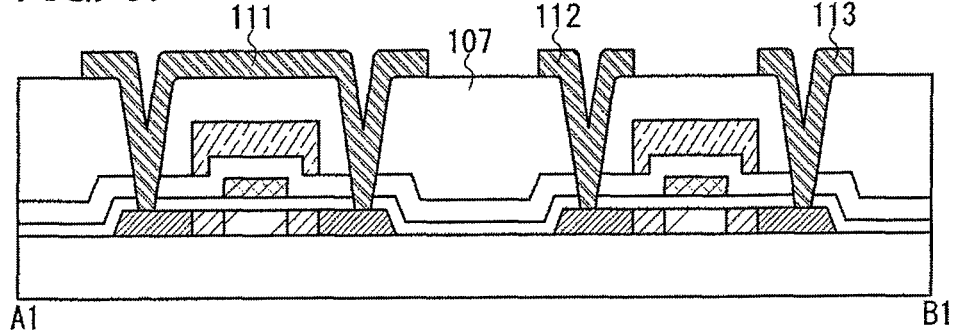
Figure 4D:
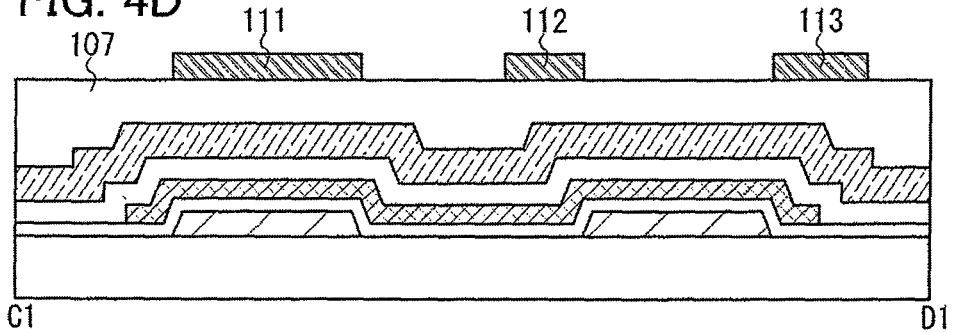

Then, after forming the third insulating film 107 to cover the control gate 106, the first conductive film 111, the second conductive film 112, and the third conductive film 113 are formed over the third insulating film 107 (see FIG. 3F and FIG. 4D).

The third insulating film 107 can be formed using an insulating film containing oxygen or nitrogen, such as silicon oxide, silicon nitride, silicon oxynitride, or silicon nitride oxide; a film containing carbon such as DLC (diamond like carbon); a film formed of an organic material such as epoxy, polyimide, polyamide, polyvinyl phenol, benzocyclobutene, or acrylic; or a film formed of a siloxane material such as a siloxane resin by a CVD method, a sputtering method, a coating method or the like.

Note that the siloxane material is a material having Si—O—Si bonds. Siloxane has a skeleton formed by a bond of silicon (Si) and oxygen (O). As a substituent, an organic group containing at least hydrogen (e.g., an alkyl group or aromatic hydrocarbon) is used. Alternatively, a fluoro group may be used as the substituent. Further alternatively, an organic group containing at least hydrogen and a fluoro group may also be used as a substituent. By forming the third insulating film 107 using a film containing an organic material or a siloxane material, unevenness due to a semiconductor film, a gate electrode and the like can be reduced. Note that, since moisture is easily absorbed in and passes through the film containing an organic material or a siloxane material, a film containing an inorganic material is preferably formed between the semiconductor film, the gate insulating film and the gate electrode and the like and the film containing an organic material or a siloxane material. For the film containing an inorganic material, a film containing silicon nitride, silicon nitride oxide or the like is particularly preferable because of its high blocking effect against moisture.

The first conductive film 111 is electrically connected to the impurity regions 108a and 108b of the first semiconductor layer 101, the second conductive film 112 is electrically connected to the impurity region 109a of the second semiconductor layer 102; the third conductive film 113 is electrically connected to the impurity region 109b of the second semiconductor layer 102. Specifically, the first insulating film 103, the second insulating film 105 and the third insulating film 107 are etched to form an opening portion, and the conductive film and the semiconductor layer are electrically connected through the opening portion.

The first to third conductive films 113 to 115 can be formed using an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn) and neodymium (Nd), carbon (C), and silicon (Si), or an alloy or a compound material containing any of these elements as its main component, by a CVD method, a sputtering method, or the like. The first conductive film 111 to the third conductive film 113 may be formed of the same material in the same process, or may be formed separately.

In this embodiment, the case where the first conductive film 111 is used for the conductive film which is in contact with the first semiconductor layer 101 through the opening portion and which functions as a rewriting line on the assumption that writing and erasing are performing using a F-N tunneling current; however, conductive films which are separate wirings may be provided.

According to the above steps, a nonvolatile semiconductor memory device provided with a memory transistor can be manufactured.

The structure of the memory transistor illustrated in this embodiment is just an example, and various known structures can be employed. For example, a plurality of LDD regions may be formed in the semiconductor layer, and a side surface of the control gate may be provided with a sidewall. Moreover, a multigate structure (a structure having a semiconductor film including at least two channel formation regions connected serially to each other, and at least two gate electrodes for applying an electric field to the channel formation regions, respectively) or a dual gate structure (a structure in which a semiconductor layer is sandwiched between upper and lower gate electrodes) may be applied.

In the nonvolatile memory described in this embodiment, by providing the semiconductor layer for writing operation and erasing operation and the semiconductor layer for reading operation separately, reading error can be suppressed even when the writing operation and erasing operation are repeatedly performed.

Note that the memory transistor illustrated in this embodiment can be implemented in combination with other embodiments of this specification.

Embodiment 3

This embodiment describes an application example of a semiconductor device which is provided with the nonvolatile semiconductor memory device described in the above embodiments and in which data can be inputted and outputted without contact, with reference to drawings. The semiconductor device in which data can be inputted and outputted without contact is also called an RFID tag, an ID tag, an IC tag, an IC chip, an RF tag, a wireless tag, an electronic tag, or a wireless chip depending on its usage mode.

Figure 8A:
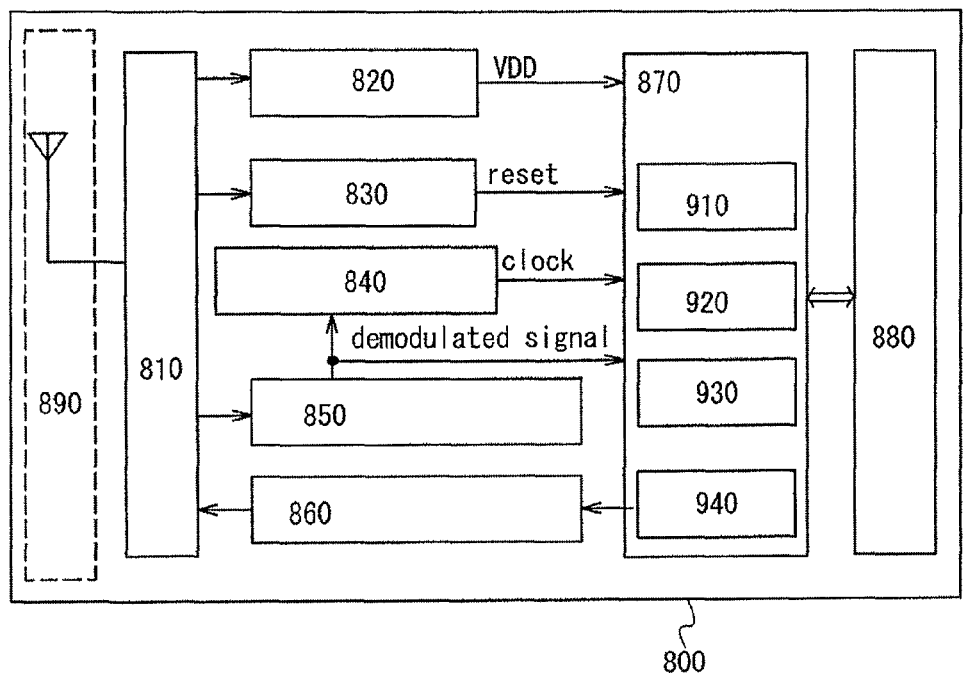
FIGS. 8A to 8C illustrate usage of a nonvolatile semiconductor memory device.

A semiconductor device 800 has a function of communicating data without contact, and includes a high-frequency circuit 810, a power supply circuit 820, a reset circuit 830, a clock generating circuit 840, a data demodulating circuit 850, a data modulating circuit 860, a controlling circuit 870 which controls another circuit, a memory circuit 880, and an antenna 890 (FIG. 8A). The high-frequency circuit 810 receives a signal from the antenna 890 and outputs a signal which is received from the data modulating circuit 860 with the antenna 890. The power supply circuit 820 generates power supply potential from a received signal. The reset circuit 830 generates a reset signal. The clock generating circuit 840 generates various clock signals based on a received signal input from the antenna 890. The data demodulating circuit 850 demodulates a received signal and outputs the demodulated signal to the controlling circuit 870. The data modulating circuit 860 modulates a signal received from the controlling circuit 870. As the controlling circuit 870, for example, a code extracting circuit 910, a code judging circuit 920, a CRC judging circuit 930, and an output unit circuit 940 are provided. It is to be noted that the code extracting circuit 910 extracts each of a plurality of codes included in an instruction sent to the controlling circuit 870. The code judging circuit 920 judges the content of the instruction by comparing the extracted code with a code corresponding to a reference. The CRC judging circuit 930 detects whether or not there is a transmission error or the like based on the judged code.

Next, an example of an operation of the above-described semiconductor device is described. First, a radio signal is received by the antenna 890. The radio signal is transmitted to the power supply circuit 820 via the high-frequency circuit 810, and a high power supply potential (hereinafter referred to as VDD) is generated. The VDD is supplied to each circuit included in the semiconductor device 800. A signal transmitted to the data demodulating circuit 850 via the high-frequency circuit 810 is demodulated (hereinafter, this signal is referred to as a demodulated signal). Further, signals that have passed through the reset circuit 830 and the clock generating circuit 840 via the high-frequency circuit 810, and the demodulated signal are transmitted to the controlling circuit 870. The signals transmitted to the controlling circuit 870 are analyzed by the code extracting circuit 910, the code judging circuit 920, the CRC judging circuit 930, and the like. Then, based on the analyzed signals, information in the semiconductor device stored in the memory circuit 880 is outputted. The outputted information of the semiconductor device passes through the output unit circuit 940 and is encoded. Further, the encoded information of the semiconductor device 800 passes through the data modulating circuit 860 and is transmitted by the antenna 890. Note that a low power supply potential (hereinafter referred to as VSS) is common in the plurality of circuits included in the semiconductor device 800, and GND can be used as VSS. In the semiconductor device 800, the nonvolatile semiconductor memory device described in the above embodiment can be applied to the memory circuit 880.

When a signal is transmitted from a reader/writer to the semiconductor device 800 and a signal transmitted from the semiconductor device 800 is received by the reader/writer in this manner, data in the semiconductor device can be read.

Further, the semiconductor device 800 may be one in which a power supply (battery) is not included and a power supply voltage is supplied to circuits by using electromagnetic waves. The semiconductor device 800 may also be one in which a power supply (battery) is included, and a power supply voltage is supplied to each circuit by using a power supply, or both electromagnetic waves and the power supply.

Figure 8B:
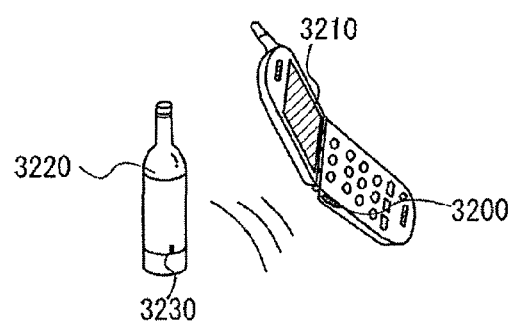
Figure 8C:
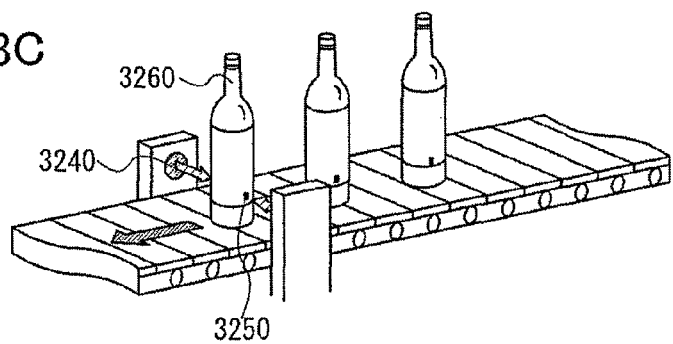

Next, an example of usage of a semiconductor device capable of inputting and outputting data without contact is described. A side surface of a portable terminal which includes a display portion 3210 is provided with a reader/writer 3200. A side surface of a product 3220 is provided with a semiconductor device 3230 (FIG. 8B). When the reader/writer 3200 is held up to the semiconductor device 3230 included in the product 3220, the display portion 3210 displays information about the product, such as its materials, its place of production, inspection results for each production step, a history of the distribution process, and further, a description of the product. Further, when a product 3260 is conveyed by a conveyer belt, the product 3260 can be inspected by using a reader/writer 3240 and a semiconductor device 3250 with which the product 3260 is provided (FIG. 8C). When the semiconductor device is used in a system in this manner, information can be obtained easily, and higher performance and higher added value are achieved.

Further, the nonvolatile semiconductor memory device described in this embodiment can be used in electronic devices which include a memory in all kinds of fields. For example, an electronic device to which the nonvolatile semiconductor memory device of the invention is applied may be a camera such as a video camera, a digital camera, a goggle-type display (a head-mounted display), a navigation system, a sound reproducing device (a car audio device, an audio component, or the like), a computer, a game machine, a portable information terminal (a mobile computer, a portable telephone, a portable game machine, an electronic book, or the like), an image reproducing device which includes a recording medium (specifically, a device which plays back a recording medium, such as a DVD (digital versatile disc), and has a display which can display the images), or the like. Specific examples of these electronic devices are shown in FIGS. 9A to 9E.

Figure 9A:
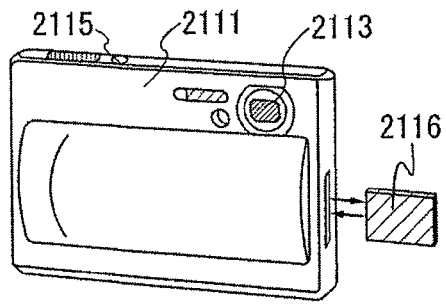
FIGS. 9A to 9E illustrate usage of a nonvolatile semiconductor memory device.
Figure 9B:
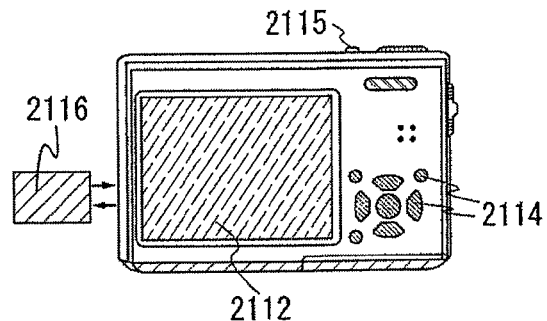

FIGS. 9A and 9B show a digital camera. FIG. 9B is a view of the back side of FIG. 9A. The digital camera includes a housing 2111, a display portion 2112, a lens 2113, operating keys 2114, a shutter release button 2115, and the like. Further, the digital camera includes a removable nonvolatile memory 2116 in which data photographed using the digital camera is stored. A nonvolatile semiconductor memory device described in this embodiment can be applied to the memory 2116.

Figure 9C:
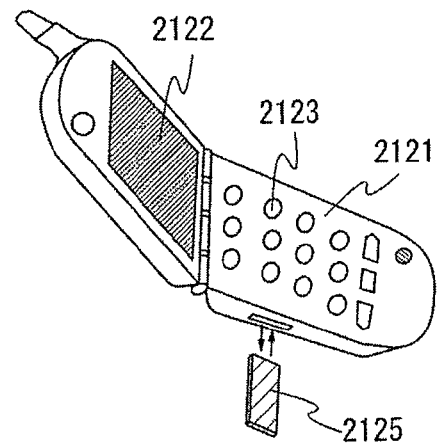

FIG. 9C shows a portable telephone, which is a representative example of a portable terminal. The portable telephone includes a housing 2121, a display portion 2122, operation keys 2123, and the like. Further, the portable telephone includes a removable nonvolatile memory 2125. Data such as the telephone number of the portable telephone and the like, images, music data, and the like can be stored in the memory 2125 and reproduced. A nonvolatile semiconductor memory device described in this embodiment can be applied to the memory 2125.

Figure 9D:
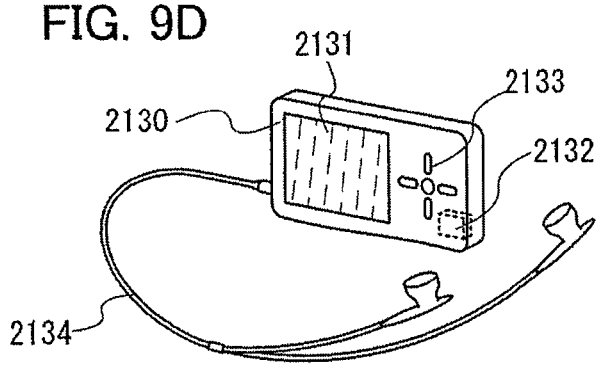

Further, FIG. 9D shows a digital player, which is a representative example of an audio device. The digital player shown in FIG. 9D includes a main body 2130, a display portion 2131, a memory portion 2132, an operating portion 2133, earphones 2134, and the like. Note that headphones or wireless earphones can be used instead of the earphones 2134. A nonvolatile semiconductor memory device described in this embodiment can be used for the memory portion 2132. For example, when a NAND-type nonvolatile memory with a memory capacity of 20 to 200 gigabytes (GB) is used and the operating portion 2133 is operated, images and sound (music) can be stored and reproduced. Note that when white characters are displayed on a black background in the display portion 2131, power consumption can be suppressed. This is particularly effective in a portable audio device. Note that a nonvolatile semiconductor memory device which is provided in the memory portion 2132 may be removable.

Figure 9E:
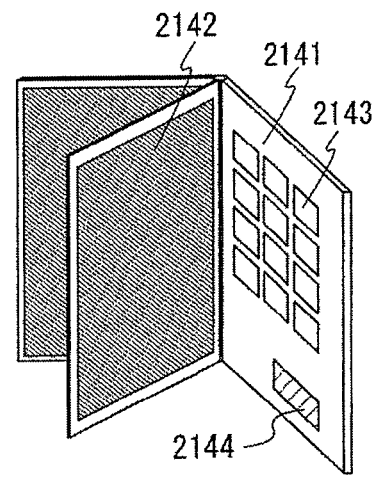

Further, FIG. 9E shows an electronic book (also referred to as electronic paper). The electronic book includes a main body 2141, a display portion 2142, operation keys 2143, and a memory portion 2144. A modem may be built into the main body 2141, or a structure in which information can be transmitted and received wirelessly may be employed. A nonvolatile semiconductor memory device formed using the invention can be used for the memory portion 2144. For example, a NAND type nonvolatile memory with a memory capacity of 20 to 200 gigabytes (GB) can be used. In addition, when operation keys 2143 are operated, an image or sound (music) can be recorded and reproduced. Note that a nonvolatile semiconductor memory device which is provided in the memory portion 2144 may be removable.

Thus, a nonvolatile semiconductor memory device described in the above embodiment has a very wide range of application, and can be used in electronic devices which include a memory portion in all kinds of fields.

EXAMPLE 1

In this example, rewriting characteristics of the nonvolatile semiconductor memory device illustrated in the above embodiment are described.

First, as the nonvolatile semiconductor memory device to be described in this example, the memory transistor provided with two semiconductor layers over the substrate 100, the structure of which was illustrated in FIGS. 1A and 1B, and 2A and 2B, was manufactured.

Specifically, a glass substrate was used as the substrate 100. A silicon nitride oxide ($SiN_xO_y$, x>y>0) film with a thickness of 50 nm and a silicon oxynitride ($SiO_xN_y$, x>y>0) film with a thickness of 100 nm were sequentially formed by a CVD method over the glass substrate.

The first semiconductor layer 101 and the second semiconductor layer 102, each of which had an island shape, were formed of a polycrystalline silicon film. The polycrystalline silicon film was formed in the following manner. First, an amorphous silicon film with a thickness of 66 nm was formed by a CVD method using monosilane as a source gas. Then, heat treatment was performed at 500° C. for one hour and at 550° C. for four hours, whereby hydrogen was released from the amorphous silicon film. Next, the amorphous silicon film was irradiated with a beam of the second harmonic (wavelength of 532 nm) of a $YVO_4$ laser, thereby being crystallized to form a polycrystalline silicon film. As the $YVO_4$ laser, a semiconductor laser (LD) pumped continuous wave laser was used. Then, the polycrystalline silicon film was processed into a desired shape by etching, whereby the first semiconductor layer 101 and the second semiconductor layer 102 were formed (see FIG. 3A and FIG. 4A).

Then, in order to form the first insulating film 103, first, high-density plasma oxidation was performed on the first semiconductor layer 101 and the second semiconductor layer 102. Then, a silicon oxynitride film with a thickness of 9 nm was formed by a plasma CVD apparatus using a monosilane ($SiH_4$) gas and a dinitrogen monoxide ($N_2O$) gas as source gases. The gas mass flow ratio of the source gases was $SiH_4$: $N_2O$=1:800, and plasma excitation was performed under the following conditions: the high-frequency power was 150 W (a frequency of 60 MHz); the film-forming temperature (substrate temperature), 400° C.; the pressure in the process chamber, 40 Pa; and the electrode interval, 28 mm. After the silicon oxynitride film was formed, high-density plasma oxidation was performed again. Through the above steps, the first insulating film 103 was formed. Next, a tungsten film with a thickness of 30 nm was formed over the first insulating film 103 by a sputtering apparatus. The tungsten film was processed into a predetermined shape by etching, whereby the conductive film which was to be the floating gate 104 was formed. Then, phosphorus (P) was added to the first semiconductor layer 101 and the second semiconductor layer 102 by a plasma doping apparatus, whereby the impurity regions 121 and 122 were formed. As the source gas, $PH_3$ diluted with hydrogen was used (see FIGS. 3B and 3C and FIGS. 4A to 4D).

Next, the second insulating film 105 was formed to cover the floating gate 104. Here, a silicon oxynitride film with a thickness of 50 nm was formed by a plasma CVD apparatus. A tantalum nitride film with a thickness of 30 nm and a tungsten film with a thickness of 370 nm were stacked over the second insulating film 105 by a sputtering apparatus. These stacked films were etched to form the control gate 106. Then, phosphorus was added to the first semiconductor layer 101 and the second semiconductor layer 102 by a plasma doping apparatus using the control gate 106 as a mask. As the source gas, $PH_3$ diluted with hydrogen was used. Through the above steps, the impurity regions 108a and 108b and the impurity regions 109a and 109b were formed in the first semiconductor layer 101 and the second semiconductor layer 102, respectively (see FIGS. 3D and 3E and FIG. 4C).

Then, a silicon oxide film with a thickness of 50 nm, a silicon oxynitride film with a thickness of 100 nm and a silicon oxide film with a thickness of 600 nm were stacked as the third insulating film 107 to cover the control gate 106. After the silicon oxide film was formed, heat treatment was performed at 550° C. in a nitrogen atmosphere, thereby activating phosphorus that had been added to the impurity regions 108a, 108b, 109a, 109b, 121, and 122. Then, an opening was formed in the stack of the insulating films 103, 105 and 107, and a conductive film having a multi-layer structure including a titanium film with a thickness of 60 nm, a titanium nitride film with a thickness of 40 nm, a pure aluminum film with a thickness of 500 nm, and a titanium film with a thickness of 100 nm was formed by a sputtering apparatus. The stacked films were processed into a desired shape by etching, whereby the conductive films 111 to 113 were formed. Through the above steps, the memory cell of this example was manufactured (see FIG. 3F and FIG. 4D).

Moreover, as a conventional example for comparison, as illustrated in FIG. 5 and FIGS. 6A and 6B, a memory transistor provided with one semiconductor layer over the substrate 100 was formed. Note that the floating gate 104, the control gate 106, the first insulating film 103, the second insulating film 105, and the like were formed using the same material and to have the same film thickness.

Subsequently, in the structure illustrated in FIGS. 1A and 1B, and FIGS. 2A and 2B, voltages of +6.0 V, −6.0 V, +6.0 V, and +6.0 V were applied to the control gate 106, the first conductive film 111, the second conductive film 112, and the third conductive film 113, respectively, in writing; then, −7.0 V, +7.0 V, −7.0 V, and −7.0 V were applied to the control gate 106, the first conductive film 111, the second conductive film 112, and the third conductive film 113, respectively, in erasing, so that a F-N tunneling current was generated between the first semiconductor layer 101 and the floating gate 104, whereby writing and erasing were performed.

On the other hand, in the structure (comparative example) illustrated in FIG. 5 and FIGS. 6A and 6B, voltages of +7.0 V, −7.0 V, and −7.0 V were applied to the control gate 106, the second conductive film 112, and the third conductive film 113, respectively, in writing; then, −8.3 V, +8.3 V, and +8.3 V were applied to the control gate 106, the second conductive film 112, and the third conductive film 113, respectively, in erasing, so that F-N tunneling current was generated between the semiconductor layer 131 and the floating gate 104, whereby writing and erasing were performed.

Note that reading was performed by applying voltages of 0 V, 0 V, and 1 V to the first conductive film 111, the second conductive film 112, and the third conductive film 113, respectively.

Figure 10:
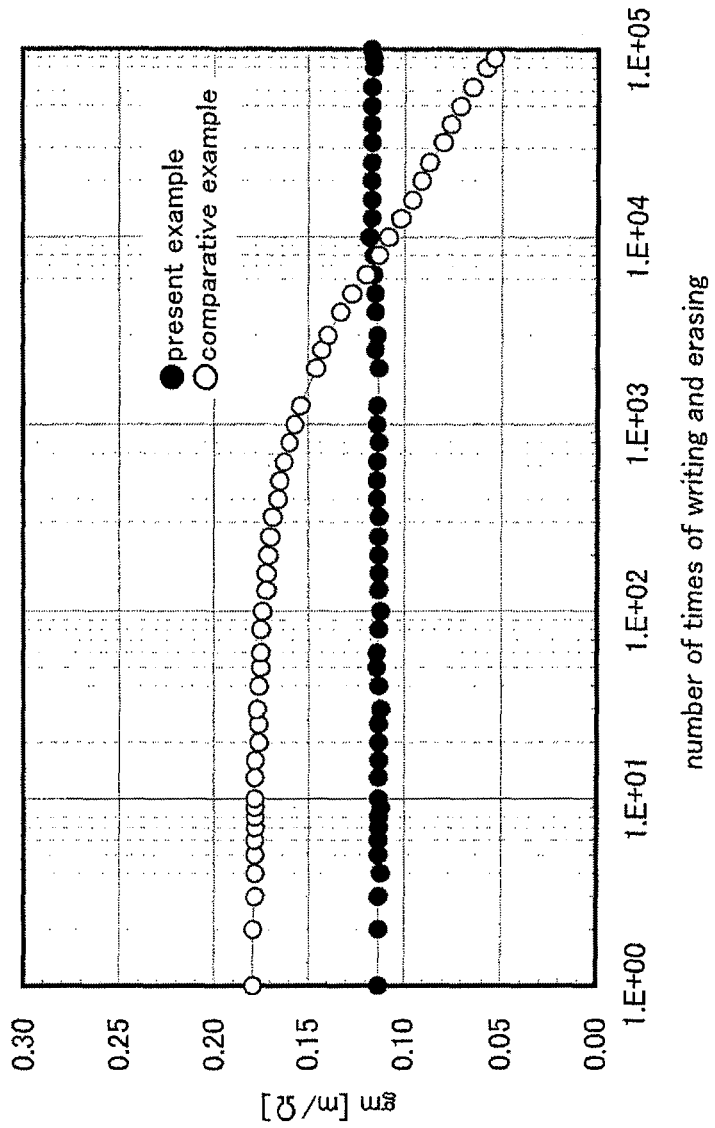
FIG. 10 illustrates rewriting characteristics of a nonvolatile semiconductor memory device.
Figure 11:
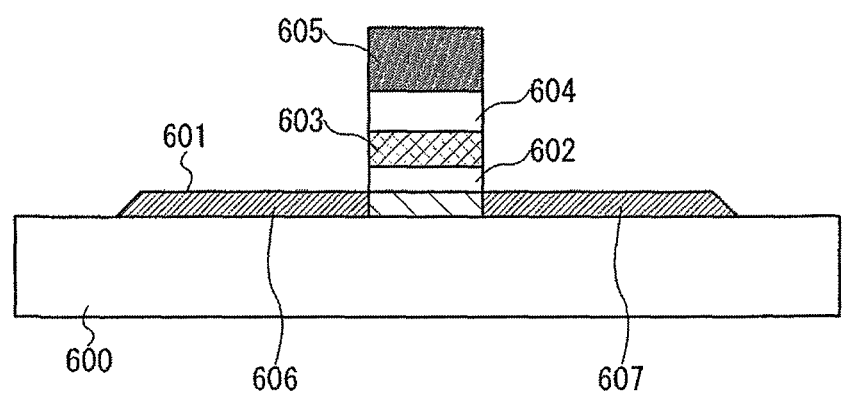
FIG. 11 illustrates a conventional nonvolatile semiconductor memory device.

FIG. 10 illustrates a change of mutual conductance (gm) in memory transistors with respect to the number of times of writing and erasing in the memory element of this example and the memory element of the comparative example.

As illustrated in FIG. 10, in the structure of the comparative example (FIG. 5 and FIGS. 6A and 6B), mutual conductance (gm) is decreased at and after about $1 \times 10^3$ times by repetition of writing and erasing. On the other hand, in the structure of this example (FIGS. 1A and 1B, and FIGS. 2A and 2B), mutual conductance (gm) is not decreased and is maintained even if writing and erasing are repeatedly performed. Therefore, with the application of the structure illustrated in FIGS. 1A and 1B, and FIGS. 2A and 2B, decrease of the mutual conductance (gm) can be controlled, and reading error of recording data can be suppressed even if writing and erasing are repeatedly performed.

This application is based on Japanese Patent Application serial No. 2008-129961 filed with Japan Patent Office on May 16, 2008, the entire contents of which are hereby incorporated by reference.

What is claimed is:
1. A semiconductor device comprising:
a first semiconductor layer comprising impurity regions;
a second semiconductor layer comprising a first region, a second region, a third region, a fourth region and a fifth region;

a first insulating film over the first semiconductor layer and the second semiconductor layer;

a floating gate over the first insulating film, the floating gate overlapping with the first semiconductor layer and the second semiconductor layer;

a second insulating film over the floating gate;

a control gate over the second insulating film, the control gate overlapping with the first semiconductor layer, the second semiconductor layer, and the floating gate, a first conductive film over the control gate, the first conductive film being electrically connected to the impurity regions;

a second conductive film over the control gate, the second conductive film being electrically connected to the fourth region; and a third conductive film over the control gate, the third conductive film being electrically connected to the fifth region, wherein the floating gate overlaps with the first region, wherein the first region is interposed between the second region and the third region, wherein the second region is interposed between the first region and the fourth region, wherein the third region is interposed between the first region and the fifth region, wherein each of the second region, the third region, the fourth region, and the fifth region comprises an impurity element, wherein an impurity concentration of the second region and the third region is lower than that of the fourth region and the fifth region, wherein the first conductive film entirely overlaps with the first semiconductor layer, and wherein the second conductive film and the third conductive film partially overlap with the second semiconductor layer.

2. The semiconductor device according to claim 1, wherein an edge of the floating gate is provided above the first semiconductor layer.

3. The semiconductor device according to claim 1, wherein the control gate is provided so as to cover the floating gate with the second insulating film interposed therebetween.

4. The semiconductor device according to claim 3, wherein the control gate overlaps with the first region, the second region, and the third region, and wherein the floating gate overlaps none of the second region, the third region, the fourth region, nor the fifth region.

5. The semiconductor device according to claim 1, wherein the first semiconductor layer is used for writing operation and erasing operation, and the second semiconductor layer is used for reading operation.

6. A semiconductor device comprising:

a first semiconductor layer comprising impurity regions;

a second semiconductor layer comprising a first region, a second region, a third region, a fourth region, and a fifth region;

a first insulating film over the first semiconductor layer and the second semiconductor layer;

a floating gate over the first insulating film, the floating gate overlapping with the first semiconductor layer and the second semiconductor layer;

a second insulating film over the floating gate;

a control gate over the second insulating film, the control gate overlapping with the first semiconductor layer, the second semiconductor layer, and the floating gate, a first conductive film over the control gate, the first conductive film being electrically connected to the impurity regions;

a second conductive film over the control gate, the second conductive film being electrically connected to the fourth region; and a third conductive film over the control gate, the third conductive film being electrically connected to the fifth region, wherein the floating gate overlaps with the first region, wherein the first region is interposed between the second region and the third region, wherein the second region is interposed between the first region and the fourth region, wherein the third region is interposed between the first region and the fifth region, wherein each of the second region, the third region, the fourth region, and the fifth region comprises an impurity element, wherein an impurity concentration of the second region and the third region is lower than that of the fourth region and the fifth region, wherein in an region between the first semiconductor layer and the second semiconductor layer, a width of the floating gate and a width of the control gate are greater in a direction parallel to the direction of the fourth region to the fifth region than a distance between the second region and the third region, wherein the first conductive film entirely overlaps with the first semiconductor layer, and wherein the second conductive film and the third conductive film partially overlap with the second semiconductor layer.

7. The semiconductor device according to claim 6, wherein an edge of the floating gate is provided above the first semiconductor layer.

8. The semiconductor device according to claim 6, wherein the control gate is provided so as to cover the floating gate with the second insulating film interposed therebetween.

9. The semiconductor device according to claim 8, wherein the control gate overlaps with the first region, the second region, and the third region, and wherein the floating gate overlaps none of the second region, the third region, the fourth region, nor the fifth region.

10. The semiconductor device according to claim 6, wherein the first semiconductor layer is used for writing operation and erasing operation, and the second semiconductor layer is used for reading operation.

* * * * *